(12) United States Patent
Dao

(10) Patent No.: US 6,407,633 B1
(45) Date of Patent: Jun. 18, 2002

(54) METHODS AND APPARATUS FOR STABILIZING FEEDBACK-CONTROLLED AMPLIFIERS

(76) Inventor: Kim Dao, 12 Nace Ave., Piedmont, CA (US) 94611-4326

( * ) Notice: Subject to any disclaimer, the term of this patent is extended or adjusted under 35 U.S.C. 154(b) by 0 days.

(21) Appl. No.: 09/992,507

(22) Filed: Nov. 16, 2001

Related U.S. Application Data

(62) Division of application No. 09/809,395, filed on Mar. 15, 2001, now Pat. No. 6,333,674.

(51) Int. Cl.[7] .................................................. H03F 1/36
(52) U.S. Cl. ........................ 330/86; 330/282; 327/554; 381/121; 333/174
(58) Field of Search ........................ 330/86, 282, 305, 330/290, 306, 284, 134, 303; 327/554; 381/121, 94.1–94.9; 333/174; 331/182, 183

(56) References Cited

U.S. PATENT DOCUMENTS

| | | | | |
|---|---|---|---|---|
| 3,475,702 A | * | 10/1969 | Ainsworth | 333/17 |
| 5,475,337 A | * | 12/1995 | Tatsumi | 327/551 |
| 5,825,250 A | * | 10/1998 | Tomasini et al. | 330/292 |
| 6,035,049 A | * | 3/2000 | Engh et al. | 381/121 |
| 6,239,654 B1 | * | 5/2001 | Yamamoto | 330/9 |

\* cited by examiner

*Primary Examiner*—Robert Pascal
*Assistant Examiner*—Henry Choe

(57) ABSTRACT

An apparatus (Z) having controllable impedance is inserted from output (22) to ground (23) of an audio-signal amplifier (20). Typically, the apparatus comprises a switch-chain (50) having multiple switches (52, 53, and so on); the first switch (52) is connected to one terminal (62) of the apparatus. A capacitor (82, 84, and so on) is connected from each switch to a second terminal (61). The network formed by the switch-chain (50) and the capacitor network (80) is called a matrix (60C). To bypass audio frequencies away from the chopping effect of the switches, an inductor (31) parallels the matrix. To prevent shorting of audio signals to ground, a larger capacitor (30) is in series with the inductor. An unstable voltage at output will see increasing capacitance as more switches are closed. The changing of capacitive impedance in relation to the amplitude of the unstable voltage is designed such that the unstable voltage cannot grow too large. More complex matrices further reduce voltage fluctuations. Logic circuits controlling transistor switches can realize better stabilization.

11 Claims, 3 Drawing Sheets

METHODS AND APPARATUS FOR STABILIZING FEEDBACK-CONTROLLED AMPLIFIERS

This is a division of Application Ser. No. 09/809,395, Filed Mar. 15, 2001. U.S. Pat. No. 6,333,674.

FIELD OF INVENTION

This invention relates to methods and apparatus for stabilizing feedback control systems, having particular application in audio-signal amplifiers.

CROSS-REFERENCE TO RELATED APPLICATION

"Not applicable".

STATEMENT REGARDING FEDERALLY SPONSORED RESEARCH OR DEVELOPMENT

"Not applicable".

REFERENCE TO A MICROFICHE APPENDIX

"Not applicable".

BACKGROUND OF THE INVENTION

Commercially available electronic sound systems are known to reproduce music that lacks the musicality of live performances. More expensive audio systems reproduce slightly better music, but are still unsatisfactory. Components of electronic sound systems include power amplifiers, pre-amplifiers, and program players. They are, in essence, electronic amplification systems using closed-loop control principle or feedback-controlled amplifiers for short.

The signal distortion that reproduces bad music comes from many causes. Major causes are nonlinear transfer function of electronic circuits (such as crossover distortion), feedback instabilities and speaker imperfections. Feedback instabilities are most difficult to understand. They are transient and not easily observable on a test bench using resistive loads and steady state input signals. They do occur during operation with real speakers and transient musical signals.

Because of the difficulty in observation and understanding of instabilities, designers do not recognize the problem. Previous circuits for stabilization comprise resistor-capacitor networks that remain basically the same for years. They are experimentally designed to suppress oscillations observed on bench testing. They comprise mainly a compensation capacitor that rolls off high frequency gain. This capacitor is connected from output to feedback terminal. Power amplifiers often have a damping inductor termination at the output; followed by a series resistor-capacitor connected to ground. Capacitors are also connected from collector to base of bipolar transistors, and resistors inserted to base and emitter. They offer little help in reducing transient instabilities.

Recently U.S. Pat. No. 5,825,250 (1998) to Tomasini, et al. disclosed a selectively switched capacitor network to replace the conventional fixed-value compensation capacitor. The purpose is to match the compensation capacitor to the closed-loop gain. When the feedback resistor changes value, the compensation capacitor network would switch to a new value to ensure sufficient stable bandwidth. This variable compensation may extend the bandwidth a little but is still the old fashion frequency compensation that will not prevent transient instabilities. Further more, amplifiers that use fixed closed-loop gain, such as audio amplifiers do not need variable compensation. The problem is deeper than that, as will be explained in the detailed description of the present invention.

Unaware of transient instabilities, designers of sound systems addressed other problems without improving sound quality:

1. Problems such as suppression of noises and electromagnetic interferences that may pollute input signals and power supplies. As sound quality is concerned, commercially available boxes offering to cleanup AC power sources are unsatisfactory.
2. Recently, problems resulted from transmission line effects are addressed in U.S. Pat. No. 4,885,555 (1989) and U.S. Pat. No. 5,222,149 (1993), both to Palmer. The apparatus disclosed by Palmer are essentially terminations using transformer effect either for impedance matching or for dissipation of ringing signals in the transmission line. The primary circuit is the signal carrying line and the secondary circuit is shorted. The apparatus are located at strategic locations along the transmission line for proper dissipation of ringing signals. Commercially available speaker cables and interconnects having complex woven patterns also produce expensive and unsatisfactory audio accessories. They are also designed to manipulate standing waves in cables considered as transmission lines.
3. Methods for improving sound quality also include selection of parts. Selection of parts often calls for exotic devices that bring about small improvement. Examples of exotic devices include special vacuum tubes, pure resistors, low-dissipation capacitors, oxygen-free copper, silver wires, gold-plated terminals. Sound quality improvement may exist between a low cost solid-state amplifier and an expensive tube amplifier. However, the small improvements cannot justify additional costs, except for a few wealthy people.
4. A very expensive speaker may sound a little better than the one costing half as much. However, the expensive speaker falls into the range of extreme diminishing return.

In conclusion, prior arts were unsatisfactory for improvement of sound quality and did not address an important cause of distortion, namely feedback instabilities.

The present invention addresses the problem of amplifier feedback instabilities uncorrected by conventional stabilization.

OBJECTS AND ADVANTAGES

It is a primary object of the invention, therefore, to provide a system for improving stability of feedback-controlled amplifiers, particularly to enrich the musicality of audio-signal amplifiers. Other objects and advantages are:

To provide a cost-effective system for improving sound quality,

To provide an add-on system for speaker terminals and output jacks of program players of sound systems already in use.

Still further objects and advantages will become apparent from a consideration of the ensuing description and drawings.

BRIEF SUMMARY OF THE INVENTION

In accordance with the present invention a method for stabilizing feedback-controlled amplifiers comprises inserting an apparatus having controllable impedance, typically, from output to ground, and applying an unstable signal (typically, the unstable output voltage itself) to control the impedance toward values where instabilities are reduced (or they cannot grow larger).

Typically the apparatus is a network having multiple configurations selected by switches. Each configuration has properly designed impedance. Switches can be transistor switches controlled by unstable signals toward configurations designed to minimize unwanted oscillations. The unstable signals should control the switches through the intermediary of a computer code that can provide prediction capability to act earlier, at the onset of instabilities.

REFERENCE NUMERALS AND LETTERS IN DRAWINGS

Figure 1B:
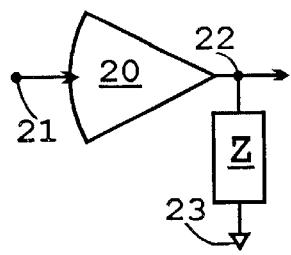
FIG. 1B shows an apparatus Z in a typical location in an amplifier circuit.

Z apparatus having controllable impedance
20 amplifier
21 input terminal
22 output terminal
23 ground terminal
24 feedback terminal
25 example of additional components connected to apparatus Z
30 auxiliary components
50 switch-chain of a matrix
51 to 56 each switch, typically a transistor
59 control terminals of transistors
60- matrix, the dash—can be replaced by element type, C, L, R, LCR
60C capacitor matrices
61 a terminal of a matrix
62 another terminal of a matrix
70 computer
71 array of voltage comparators
72 analog-to-digital (AID) converter
73 computing code using LOGIC circuits or PATTERN generator
74 input terminals of 72 (or of 71) (or of 70)
76 outputs of 73 (or of 71) (or of 70)
80 element network of a matrix 60—
82 to 93 elements, typically capacitors C
Elements can be inductor L, resistor R and a combination LCR.

DETAILED DESCRIPTION OF THE INVENTION

Guiding Theory for the Invention

Before discussion of methods and apparatus, it is helpful to understand the guiding principle of the invention.

To designers of amplifiers, the following formula is familiar:

$$G=A/(1+A\times F)$$

Where:
G is the closed-loop gain=Vout/Vin
Vout is the output voltage
Vin is the input voltage
A is the forward gain=Vout/(Vin−Vfb)
Vfb is the feedback voltage; (Vin−Vfb) is the error
F is the feedback fraction=Vfb/Vout
A×F is the open-loop gain=Vfb/(Vin−Vfb)

At a frequency fc, the open-loop gain may become −1, meaning its modulus is 1 and its phase is −180 degrees with respect to Vin. If this happens, G becomes infinity because the denominator is zero. This condition is positive feedback, meaning Vfb keeps on adding to Vin such that the error keeps on growing. Any non-zero Vin at fc ,will be amplified and growing beyond control.

If A depends only on frequency, then, frequency dependent components can be added to modify F such that the equation A×F=−1 has no solution in terms of frequency. And stability is restored. This has been the conventional strategy for stabilization. F is modified by a well-matched compensation capacitor, in parallel with the feedback resistor.

However, in reality, A depends also on other parameters such as transistor transient currents, voltages or even instantaneous junction temperatures. The consequence is that equation A×F=−1 will have solutions when the parameters shift to opportune values, regardless of prior-art stabilization components.

A remedy for shifting A is disclosed in the present invention. Basically the method recommends that stabilization components must be controllable to catch up with shifting parameters. If the parameters are unknown or difficult to compensate, then the unstable voltage itself can be used for controlling stabilization components. At least the. growth of instabilities can be limited. In the following sections, signals derived from the monitoring of shifting parameters that cause instabilities and the resulting unstable voltages are called collectively as unstable signals.

Therefore, the method comprises inserting controllable impedance into the circuitry of the open-loop gain and letting the unstable signals control the impedance negatively, meaning to reduce the growth of unstable voltages. To accomplish this, four interdependent tasks are needed:

(a) Design a network that can change impedance,
(b) Select an effective location to insert the network into the open-loop circuitry,
(c) Select an effective unstable signal to control the impedance,
(d) Determine a stabilization relationship between impedance and the unstable signal.

In principle, every amplifier has its own optimum stabilization relationship. Optimum means fluctuations of unstable voltages are most reduced. Tasks (a) to (d) aim for closest approximation to the optimum stabilization relationship. Presently, the relationship is unknown and task (d) must be performed by time-consuming experimentation. But in the future, the relationship may be known from mathematical analysis of the amplifier, taking into account relevant parameters.

Networks having controllable impedance were used for gain control, offset adjustment, frequency compensation. However, none suggested using unstable signals to control the networks. The wrong controlling signal will not stabilize the amplifier. The following detailed description concerns a proven satisfactory way to stabilize amplifiers. Details discussed include:

- how to construct an apparatus having controllable impedance,
- where are effective locations for the apparatus and to pickup an unstable signal,
- and how to determine experimentally an effective relationship.

Figure 1C:
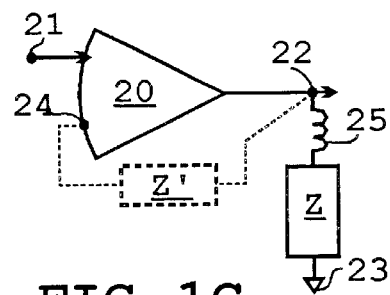
FIG. 1C shows example of added components. Also apparatus Z' can be in a different location.
Figure 1:
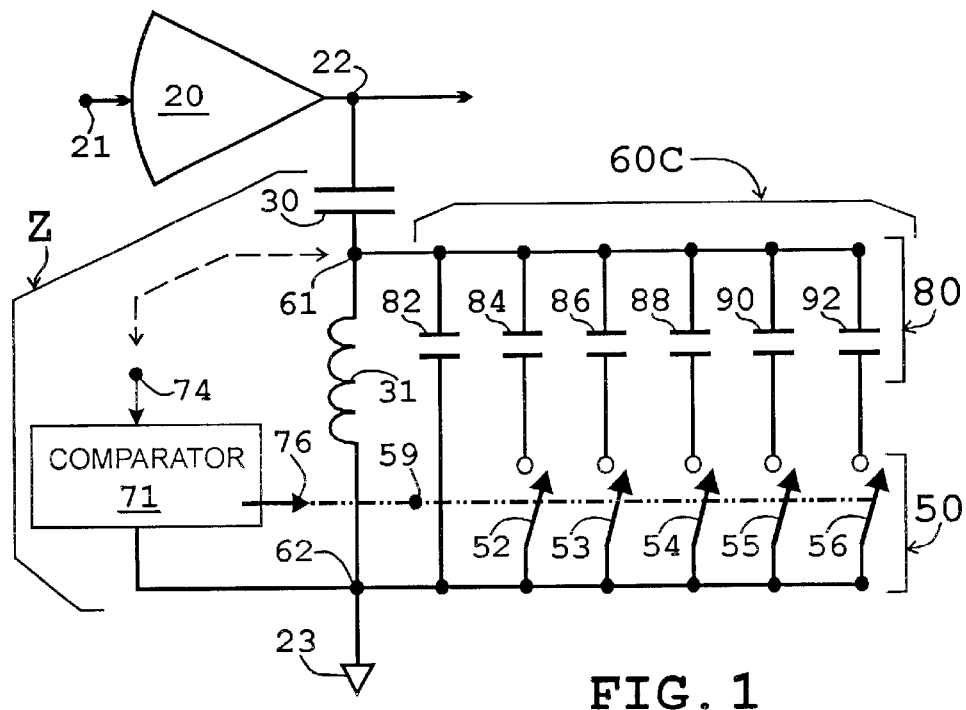
FIG. 1 shows a basic construction of apparatus Z.

Description—FIGS. 1, 1B, 1C

Figure 3:
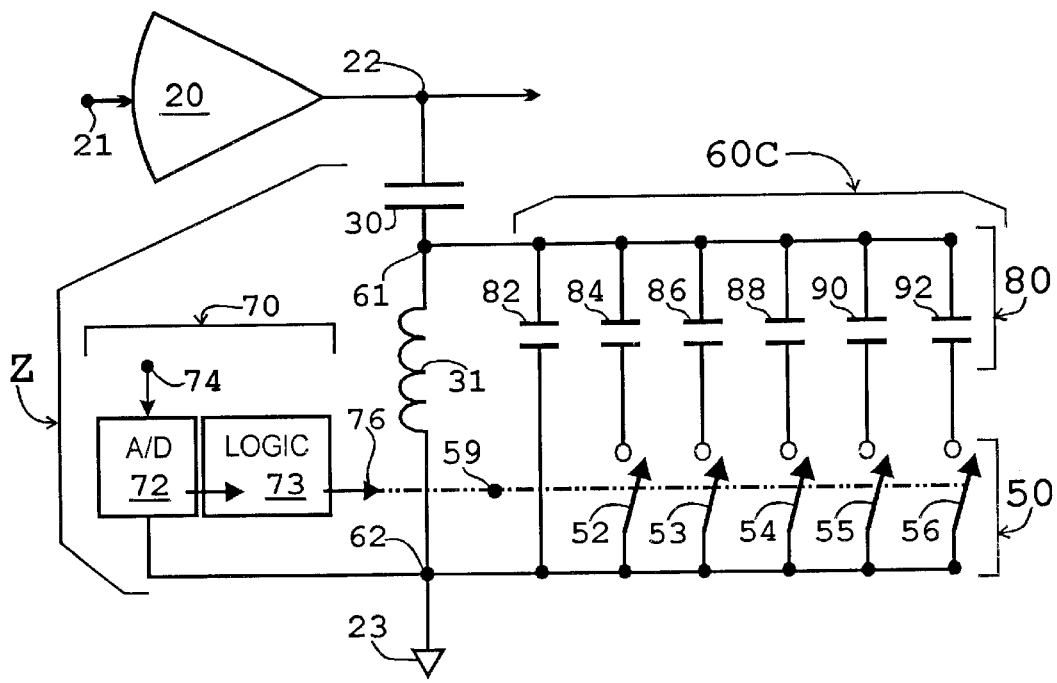
FIG. 3 shows a digital-computer embodiment of apparatus Z.
Figure 4:
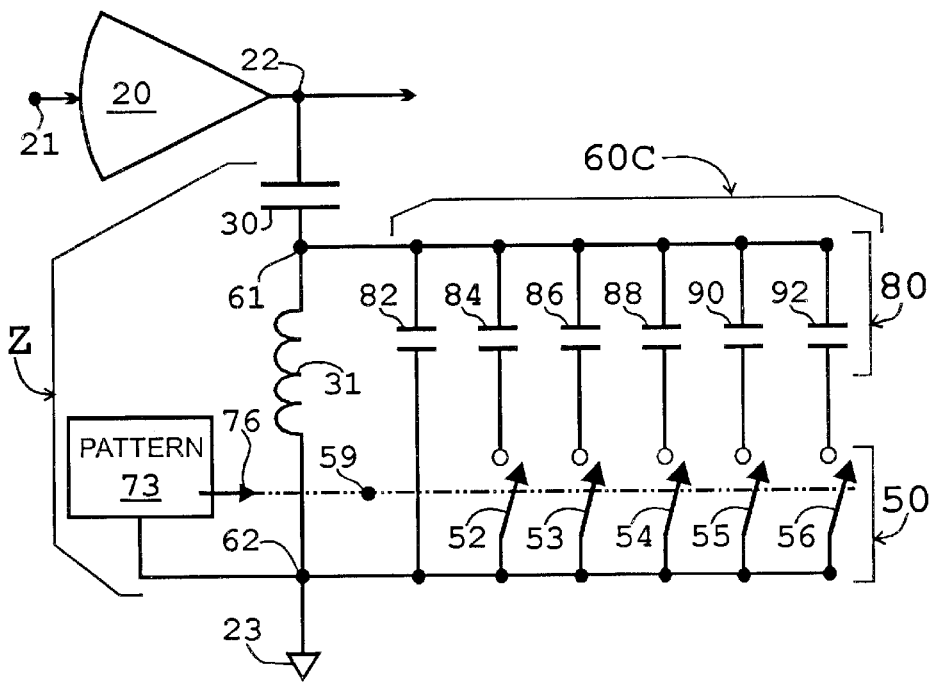
FIG. 4 shows control of impedance by internal pattern generator.

FIG. 1 shows the basic embodiment of an apparatus Z having controllable impedance. This basic design is the foundation for other apparatus built to suit a design goal. FIG. 3 is designed for best sound if quality and FIG. 4 is a compromise.

FIG. 1 comprises:

- a network having controllable impedance called a matrix, matrix 60C,
- auxiliary components: inductor 31 to bypass low (audio) frequencies away from the matrix and capacitor 30 to block low frequencies from conducting through the apparatus,
- an array of voltage comparators, called detector 71. An unstable signal is applied to terminal 74 of detector 71. The application of the unstable signal to terminal 74 is preferably through the intermediary of a high pass device to reject low (audio) frequencies. The comparators compare the signal to thresholds (or references), then produce an individual output but collectively named as outputs 76.

Conventional parts such as power supplies are not shown.

Auxiliary components are optional. They are included mostly to reduce jittering created by unavoidable switching of audio frequency currents. If such jittering is negligible (i.e. Audio currents switched are small), inductor 31 can be deleted. When inductor 31 is absent, capacitor 30 may be redundant. Inductor 31 can also split into many inductors. Each can be connected in parallel to one switch for bypassing low frequencies away from each switch. This arrangement can eliminate capacitor 30 if the elements are capacitors, and it has the advantage of more effective blocking the return to ground of low frequencies. However, it is more expensive.

The linkage between outputs 76 and matrix 60C is the essence of the control of impedance by the unstable signal at 74. Matrix 60C comprises an element network 80 having typically capacitors as elements: 82, 84, 86, 88, 90, 92, and a switch-chain 50 having typically transistors as switches 52, 53, 54, 55, 56 (such as metal-oxide-silicon field-effect transistors, bipolar transistors). The gates (or bases) of transistors are shown collectively as control terminals 59. Analog switches are preferred, but other unidirectional transistor switches can be satisfactory. Designs for unidirectional switches must ensure proper removal of stored energy.

The parallel elements are connected to a terminal 61 of matrix 60C, and the parallel switches are connected to a terminal 62 of matrix 60C. The free end of each capacitor is connected to the free end of a corresponding transistor. The elements of element network 80 are typically capacitors but other devices may be used, such as inductors, resistors, diodes, optocouplers and so on.

When a control terminal 59 of a transistor receives a proper controlling signal it will close or open. Such controlling signal comes from an output 76 of a corresponding comparator. There are 5 switches and 5 comparators, as shown in FIG. 1. Capacitor 82 is always in conduction. Each comparator detects one level of unstable signal therefore the accuracy of detection depends on the number of comparators.

Comparators of detector 71 set the voltage scale of unstable signal. As the unstable signal fluctuates, the states (opened/closed) of the switches vary accordingly. The closed switch parallels one element to alter the configurations of matrix 60-. Therefore, there is a one-to-one correspondence between the amplitude of the unstable signal and the identity of the parallel configurations of matrix 60-. Each configuration of matrix 60- corresponds to a value of its impedance. This one-to-one correspondence is the stabilization relationship.

The state of a switch is preferably either opened or closed because this allows a more accurate design of the element. But the switch can have a wide impedance range between open and close. Therefore, the definition of states should be understood in terms of impedance variation of the switch with respect to the amplitude of the controlling signal. Definitely, the selection of characteristics of switches influences the designed values of the elements.

Following is a discussion on the locations of apparatus Z in an amplifier circuit.

All components mentioned above belong to apparatus Z. It will be inserted in the circuitry of amplifier 20. Experimentation or mathematical analysis of the amplifier can determine suitable locations. A proven good location is between amplifier output 22 and ground 23. FIG. 1B shows such position of apparatus Z in an overall circuit comprising an amplifier 20 having input terminal 21. Internal amplifier circuitry and conventional input source and load are not shown. Also input terminal 74 of detector 71 is not shown as opened because it is connected to terminal 61 of matrix 60C. Such connection of terminal 74 to terminal 61 conforms to the assumption that the unstable voltage (at output 22) itself is the best available signal for controlling the impedance. However, other ways of connection are possible and should be explored.

How apparatus Z is inserted into the amplifier circuitry also remains to be explored because there are many ways to design and to affect the open-loop gain. Apparatus Z can be inserted between terminals 22 and 23 through the intermediary of (i.e. in series with) other components: such as an inductor, or a network in general. FIG. 1C shows an example of insertion of apparatus Z through intermediary of a component such as inductor 25. FIG. 1C also shows that apparatus Z' can be inserted from output 22 to feedback terminal 24. Cutting an existing path for the insertion of apparatus Z is another way of connecting Z to the circuit, for example, Z can be inserted between terminals 22 and 23 in series with the load.

To be consistent, in the following description, the word connection indicates a precise location and the word insertion used for connection of a network having at least two terminals to at least two locations in the overall circuit, with or without cutting and/or intermediary parts. In generality, the two terminals of the inserted apparatus are in communication with the two locations of the circuitry. These alternative insertions are not shown in figures because the description is already clear.

Intermediary networks are important when many apparatus Z are used; each apparatus can be tuned for a particular frequency range filtered by intermediary networks. Better frequency discriminating networks can replace simple network of one inductor.

Figure 7:
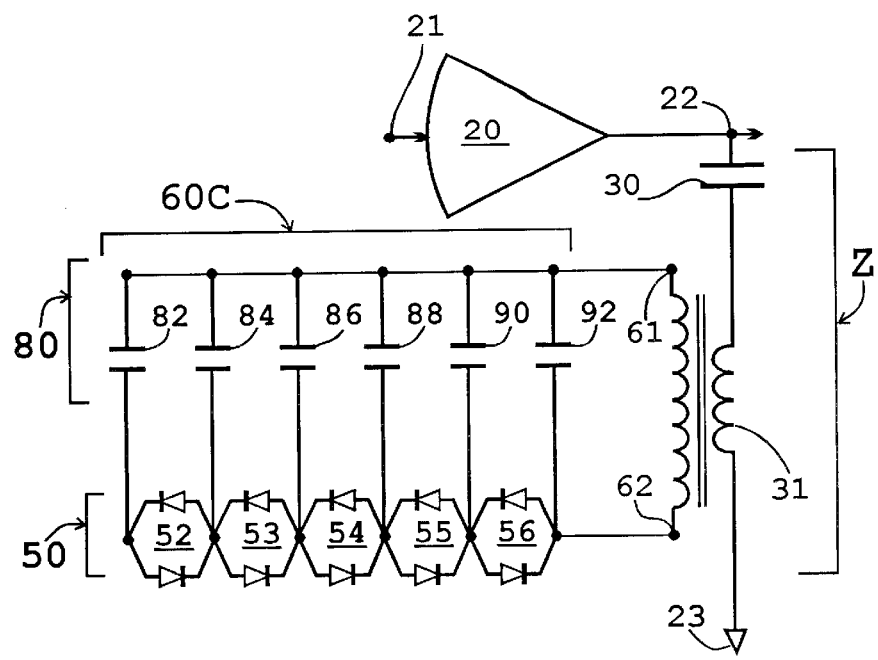
FIG. 7 shows a transformer adaptation for achieving smaller voltage steps.
Figure 8C:
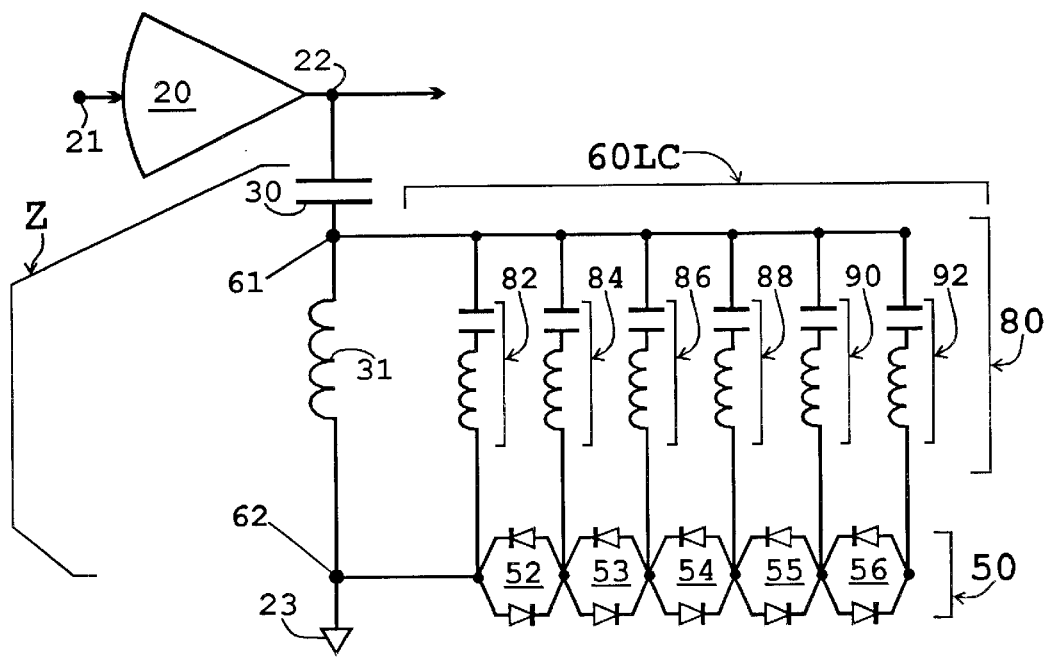
FIG. 8C shows a possible embodiment of matrices, using a variety of elements.

As discussed above, input 74 of detector 71 should be connected to terminal 61 because the best location for apparatus Z and the best signal for controlling impedance are believed to be at output 22 and ground 23. Then both switch and comparator see the same voltage. Therefore, a voltage regulator (such as zener diode) having the same threshold can replace them both. Voltage regulators are used here as threshold switches, meaning to prevent current conduction into a component until the voltage reaches a predetermined value. Threshold switches 52, 53, 54, 55, 56 of FIG. 7 and FIG. 8C are constricted with diodes.

Description—FIGS. 3, 4

Improvement to FIG. 1 is considered below, in the pursuit of better reproduction of sound.

First, FIG. 1 can be modified to reduce the number of switches for a needed increase in number of comparators. More comparators define the voltage scale more accurately. If an encoder is added to provide digital conversion, the 5-switch switch-chain of FIG. 1 can now accommodate 31 comparators for 32 voltage steps including 0. The combination comparator-encoder constitutes an analog-to-digital converter (A/D) 72 shown in FIG. 3.

Secondly, a LOGIC circuit 73 is added in FIG .3 for more flexibility in the approximation of the optimum stabilization relationship. Values of capacitors can be determined by about equal spread between the 32 successive values obtained by 32 parallel configurations possible with different combinations of the states of the 5 switches: 52, 53, 54, 55, 56. Capacitor ratios can be fixed at 1, 2, 4, 8, 16, 32 respectively for capacitors 82, 84, 86, 88, 90, 92. Then only one capacitor value need be determined in conjunction with a computing code (or instruction) for logic circuit 73. The code identifies a parallel configuration for each of the 32 voltage steps.

The combination of A/D converter 72 and logic circuit 73 will be called a computer 70. Computer 70 has inputs 74 and outputs 76. Theoretically, apparatus of FIG. 3 can reduce fluctuations of unstable voltages more than the apparatus of FIG. 1 because it has prediction capability provided by the possible monitoring of shifting parameters. These monitored data are applied to terminals 74, processed and digitized, then fed to a computing code preprogrammed into computer 70 for computing the states of the switches. Apparatus of FIG. 3 can predict the coming of instabilities and acts earlier to suppress the onset of instabilities.

Other components of FIG. 3 are the same as for FIG. 1. FIG. 3 shows a sending and receiving line between logic outputs 76 and control terminals 59 of the switches. This communication can be simple wires or light by optical coupling (or electromagnetic by transformers). Indirect coupling by light should be desirable because it allows matrix 60-to be complex and mobile, resulting in broader choices of circuit designs for better stabilization.

The different degrees of processing of unstable signal: namely from simple comparator, analog-to-digital converter, to computer will be called collectively a processor. The processor has at least an input terminal where an unstable voltage is applied. It processes the input according to an instruction, then provides at least an output. The instruction can include spectrum analysis of the input to obtain information on amplitudes and frequencies, useful for controlling a set of frequency specific matrices.

Another possible simplification of FIG. 3 is the elimination of the A/D converter. It is shown in FIG. 4. Indeed, the stabilization relationship may be approximated by some typical-unstable-pattern 73 representation of unstable signals. An internal generator 73 for typical-unstable-pattern signal may replace all real time inputs applied to terminals 74.

More reduction of cost may be possible for FIG. 4 because the generator 73 of typical-unstable-pattern signal and circuits for providing outputs 76 need not be a computer, it can be simple conventional wave generators or simple gate arrays.

Description—FIG. 7

If smaller step size for the voltage scale set by thresholds is desired, a transformer circuit of FIG. 7 can be used. Selection of turn ratio and number of switches determine step size. New values for capacitors should be recalculated by transformer formulas.

An auto transformer may replace the transformer of FIG. 7. Primary inductance and leakage inductance should be adjusted, 33 micro-H and 1% leakage are good starting values. High frequency performance of the transformer is important; it must be good up to at least 2 MHz because frequency of unstable voltages may reach 10 MHz.

Description—FIG. 8C

Typical elements are capacitive C, but other kinds of element may be used.

FIG. 8C show possible elements 82 to 92 for the construction of matrix 60LC. Other elements can be inductive L, resistive R, and combinations of LCR. Corresponding matrices are 60L, 60R and 60LCR. More exotic devices can also be used for switch-chain 50 and/or for the element network 80. For example: variable capacitance diodes, field-effect current regulator diodes, other constant current devices can substantially modify the impedance of the elements and/or the knee curvature of the steps.

FIG. 8C is shown with threshold switches in series, however they are exactly applicable to transistor/threshold switches in parallel. A simple substitution for the switches would suffice. In practice, the matrices should contain both kinds of switches for more flexibility and less cost.

Operation—Change of Impedance in Response to a Signal

The operation of the apparatus for stabilizing amplifiers comes from guiding theoretical considerations. Stabilization components should be frequency dependent, but should also be dependent upon other amplifier parameters. Therefore the apparatus must have controllable (or adjustable) impedance. One way to change the impedance in a desirable way is the use of controllable switches for the formation of different circuit configurations in a network. The choice of controllable switches depends on where the controlling signal comes from. Starting with low cost threshold switches that can change states only by the unstable voltage applied across its terminals. The switch can graduate up to a three-terminal transistor switch, adding more freedom to the choice of unstable signals (FIG. 1). The upgrading can proceed further into monitoring of parameters of the amplifier and computer switch control using sophisticated codes for possible predictive capability (FIG. 3). In principle, the degree of stabilization depends mainly on the cost of the stabilization apparatus.

Overall principle of impedance variation in relationship with voltage amplitude is already explained in the description of FIG. 1 More accurate impedance moduli and phase angles are not discussed, only a simplified presentation of how the impedance changes with the voltage. The impedance between the terminals 61 and 62 of apparatus Z shown in FIGS. 1, 3, 4 is nonlinear, meaning the impedance depends on voltage (or current) and/or time.

First simplification is linear approximation.

By definition, impedance=(voltage across a device)/(current through the device). Conforming to this definition, the term impedance is associated with the locations where the voltage is measured. To be accurate, impedance is determined between two terminals. In the above discussions, impedance is loosely given to apparatus Z. In fact it should be specified that the impedance of Z is between terminals 61 and 62. More precise qualification should also be given to the path of the current. However, current path is implied to be total current through the conducting elements. With nonlinear devices, current and/or voltage are non-sinusoidal; the fundamental frequency is used in approximated analysis. The harmonics generated by the device are ignored. For example, if the driving voltage is sinusoidal V at a frequency f, then the current I is non-sinusoidal. Ignoring the harmonics of the current, the current at the fundamental frequency f is I, and the linear impedance Z is V/I.

Second simplification is to ignore auxiliary components.

As high frequencies are concerned, inductor 31 approximates an open circuit and capacitor 30 approximates a short circuit. High frequencies are frequencies higher than the upper boundary of the bandwidth of interest. Thus, as high frequencies are concerned, apparatus Z can be approximated by matrix 60C.

Third simplification is to consider one unstable frequency.

Let X1, X2, X3, X4, X5, and X6 represent respectively the impedance moduli of capacitors 82, 84, 86, 88, 90, and 92. Since the values of capacitors remain unchanged, their impedances depend only on frequency. For each given frequency, the impedances X1 to X6 are constant.

Let V represents the unstable voltage across terminals 61 and 62.

When V starts to increase from zero, only capacitor 82 is in conduction (it is so always), therefore the impedance is only X1. When V breaks over the first threshold, switch 52 closes and capacitor 84 starts conducting, therefore the impedance is now X1 in parallel with X2. When V breaks over the first and the second thresholds, switches 52 and 53 close and capacitor 86 starts conducting, therefore the impedance is now X1, X2 and X3 in parallel. The impedance decreases. And so on until V is larger than all thresholds. Now all capacitors are in conduction, the impedance is lowest.

V starts decreasing from maximum. First, capacitor 92 stops conducting, then capacitor 90, and so on, until capacitor 84 stops conducting. The impedance increases. V starts becoming negative. Again, capacitor 84 starts conducting first, then capacitors 86, 88 and so on, until all capacitors are conducting. The impedance decreases again. V starts increasing from minimum. First, capacitor 92 stops conducting, then capacitor 90, and so on, until capacitor 84 stops conducting. V is now in the neighborhood of zero, a cycle of oscillation of V is completed.

The parallel configurations of elements change during an oscillation cycle. The current-voltage phase relationship is even more intractable. In FIG. 1, the chosen values for each threshold and the value of each capacitor 82, 84, 86, 88, 90, 92 define a design for a step-wise approximation to stabilization relationship. Finer steps produce better approximation.

If some switches are also controlled by signals other than the voltages across its terminals, the nonlinearity is even more complex (FIG. 3). The impedance is not only voltage dependent but is also time-dependent. The impedance changes during an oscillation of the voltage across its terminals, and at the same time, modulated by the signal that controls transistor switches.

Conclusion

Accordingly, the reader will see that prior art amplifiers are not stable, and that stabilization of feedback controlled-amplifiers is possible and leads to better sound quality. There may be many ways to construct and hook-up an apparatus according to the method of this invention. However, the basic apparatus disclosed in FIG. 1 is effective toward reducing instabilities. It is not enough to insert variable impedance in the amplifier circuitry. This can make instabilities worst. The impedance must be able to change in relation to instabilities, according to specific code. Further development will lead to even better sound. However, the present tested embodiments already improve musicality of electronic sound systems beyond the best prior options.

Although the description above contains specificities, these should not be construed as limiting the scope of the invention but as merely providing illustrations of some of the presently preferred embodiments of this invention. For example:

Inserting apparatus Z between output and ground (as shown in FIG. 1) is suitable as an add-on system. But other possibilities exist, such as the insertion between any of the following locations:

an output of any amplifying stage of the amplifier, including the last one, ground, feedback terminal, input terminal, terminals of power supplies, transistor control terminals, terminals for "constant-current" source in the common emitter of emitter-coupled difference amplifiers.

All of the above mentioned locations have strong influence on the open-loop gain, modulus wise and phase wise. The shifting impedance (in the right direction) of an apparatus inserted therein will steer the open-loop gain away from the value of–1.

Amplifier circuits vary widely. Therefore alternative designs should be explored to use more effectively the apparatus at locations other than output and ground.

Thus the scope of the invention should be determined by the appended claims and their legal equivalents, rather than by the examples given.

I claim:

1. A method for stabilizing a feedback-controlled amplifier, comprising:

(a) providing a controllable stabilizing network having terminals and having:
   at least a control terminal, and
   means for changing impedance value between the terminals in response to a signal applied to the control terminal, (b) inserting the network between at least two locations in the circuitry of the amplifier for affecting the open-loop gain of the amplifier in response to the changing impedance value of the network, and (c) applying an unstable signal to the control terminal for changing the impedance value of the network, whereby feedback instabilities of the amplifier will be reduced by designing the value of the impedance into a stabilization relationship with the unstable signal.

2. The method of claim 1 wherein the insertion is between an output of an amplifying stage of the amplifier, and ground.

3. The method of claim 1 wherein the unstable signal includes a typical-unstable-pattern signal.

4. An apparatus for stabilizing a feedback-controlled amplifier, comprising:
  (a) a controllable matrix having terminals and having:
    at least a control terminal, and
    means for changing impedance value between the terminals in response to a signal applied to the control terminal,
  (b) means for connecting the terminals of the matrix to at least two locations in the circuitry of the amplifier, and
  (c) means for connecting an unstable signal to the control terminal,
whereby feedback instabilities of the amplifier will be reduced by designing the value of the impedance into a stabilization relationship with the unstable signal.

5. The apparatus of claim 4 wherein the two locations include an output of an amplifying stage of the amplifier and ground.

6. The apparatus of claim 4 wherein the unstable signal includes a typical-unstable-pattern signal.

7. The apparatus of claim 4 wherein said means for changing impedance value between the terminals includes a controllable switching means connected to the control terminal and connected in series with an element.

8. The apparatus of claim 7 wherein the matrix is connected in parallel with a low-pass means and wherein the means for connecting the terminals include a high-pass means.

9. The apparatus of claim 7 wherein the means for connecting the terminals includes transformer means having a secondary winding means connected in parallel with the matrix and a primary winding means in series with a high-pass means.

10. The apparatus of claim 7 wherein the element includes an inductive device.

11. The apparatus of claim 7 wherein the element includes a capacitive device.

* * * * *